United States Patent [19]

Sheard

[11] 3,851,228

[45]*Nov. 26, 1974

[54] CAPACITOR WITH COPPER OXIDE CONTAINING ELECTRODE

[75] Inventor: John Leo Sheard, Williamsville, N.Y.

[73] Assignee: E. I. du Pont de Nemours and Company, Wilmington, Del.

[ * ] Notice: The portion of the term of this patent subsequent to Oct. 2, 1990, has been disclaimed.

[22] Filed: Apr. 23, 1973

[21] Appl. No.: 354,182

Related U.S. Application Data

[62] Division of Ser. No. 245,903, April 20, 1972, Pat. No. 3,763,409.

[52] U.S. Cl. .................... 317/258, 106/1, 161/196, 252/514

[51] Int. Cl. .................... H01g 1/01

[58] Field of Search ............ 161/213, 196; 252/514; 317/258; 106/1

[56] References Cited

UNITED STATES PATENTS

| | | | |
|---|---|---|---|
| 3,414,417 | 12/1968 | Miller | 252/514 X |
| 3,674,515 | 7/1972 | Kelemen | 252/514 X |
| 3,756,834 | 9/1973 | Short | 252/514 X |
| 3,763,409 | 10/1973 | Sheard | 317/258 |
| 3,776,769 | 12/1973 | Buck | 252/514 X |

OTHER PUBLICATIONS

Brady Materials Handbook, McGraw–Hill, New York, 1959 p. 281.

*Primary Examiner*—E. A. Goldberg

[57] ABSTRACT

Improved glass-free metallizations for formation of conductors on substrates, comprising specified proportionate amounts of (a) copper oxide or a precursor of copper oxide, and (b) palladium or palladium oxide. Also substrates having such metallizations fired thereon, and capacitors thereof.

17 Claims, 2 Drawing Figures

PATENTED NOV 26 1974 3,851,228

SHEET 1 OF 2

CAPACITOR WITH COPPER OXIDE CONTAINING ELECTRODE

CROSS-REFERENCE TO RELATED APPLICATION

This application is a division of my co-pending application USSN 245,903, filed Apr. 20, 1972 now U.S. Pat. No. 3,763,409, issued Oct. 2, 1973.

BACKGROUND OF THE INVENTION

This invention relates to metallizations for electronic circuitry, and, more particularly, to improved metallizations for producing conductor patterns.

Metallizations useful in producing conductors for electronic circuitry comprise finely divided metal particles, and are often applied to dielectric substrates in the form of a dispersion of such particles in an inert liquid vehicle. Selection of the composition of the metal particles is based on a compromise of cost and performance. Performance normally requires the use of the noble metals, due to their relative inertness during firing on dielectric substrates to produce electrically continuous conductors, since non-noble metals often react with the dielectric substrate during firing. This problem of reactivity is aggravated when electrode and substrate are cofired, that is, when metal patterns are deposited on green (unfired) ceramic sheets and the entire assembly is cofired. However, among the noble metals, silver and gold melt quite low (960°C. and 1,063°C., respectively) and, hence, preclude the economy of simultaneously cosintering the dielectric substrate conductor pattern thereon, since the commonly used dielectric materials sinter at high temperatures, that is, above 1,100°C. (e.g., $BaTiO_3$ sinters at about 1,350°C. and $Al_2O_3$ at about 1,600°C.). Melting of the conductor pattern results in formation of discontinuous globules of metal. Palladium (m.p. 1,555°C.) and platinum (m.p. 1,774°C.) possess obvious advantages over gold and silver in this respect, among the more abundant noble metals.

Despite the obvious performance advantage in using noble metals, cost of those metals is a distinct drawback. Palladium is desirable as the principal or sole metal in conductor metallizations due to its low cost relative to other noble metals (e.g., platinum costs 3–4 times as much currently). Palladium is, however, much more expensive than base metals such as copper; hence, a metallization employing palladium diluted by copper, but not suffering from diminution in performance characteristics (e.g., low melting point, poor conductivity, poor adhesion to the substrate, reactivity to the substrate, instability in air during firing above 1,100°C.) is a significant technical goal.

The cost-performance balance mentioned above often results in the dilution of the conductor metal in the metallization with a nonconducting inorganic binder, such as glass frit, $Bi_2O_3$, etc., to increase the adhesion of the sintered conductor to the substrate. A system which does not require the use of such a nonconducting binder to achieve good conductor bonding to substrate is desirable.

The above properties are especially desired in a low-cost, high-performance metallization for use as an inner electrode in the formation of monolithic multilayer capacitors, comprising a multiple number of alternating conductor and dielectric layers, such as those of U.S. Pat. No. 3,456,313. Applicant has accordingly invented such a low-cost, palladium-based, fritless, high-performance metallization.

SUMMARY OF THE INVENTION

The term "metallization" as applied to the present invention refers to a powder of finely divided noble metal and copper or compounds thereof, a more fully set forth herein. The finely divided powder is suitable for dispersion in an inert liquid vehicle to form a "metallizing composition." The latter is useful to print desired electrode patterns on dielectric substrates, which upon firing produce conductors.

This invention provides improved glass-free metallizations useful for formation of conductors on dielectric substrates (prefired or unfired substrates), comprising (a) palladium, palladium oxide or mixtures thereof and (b) copper oxide, precursors of copper oxide or mixtures thereof, the weight ratio of copper to palladium (calculated as the element) being up to 2.5/1. The metal particles are of such a size that 90 percent of the particles are not greater than 5 microns; also dispersions of such metallizations of 60–80 parts Pd, 5–15 parts Ag, and 10–30 parts of one or more members of the group consisting of copper and oxides of copper.

Also provided are dielectric substrates having such metallizations fired thereon and capacitors thereof.

DETAILED DESCRIPTION

Figure 1:
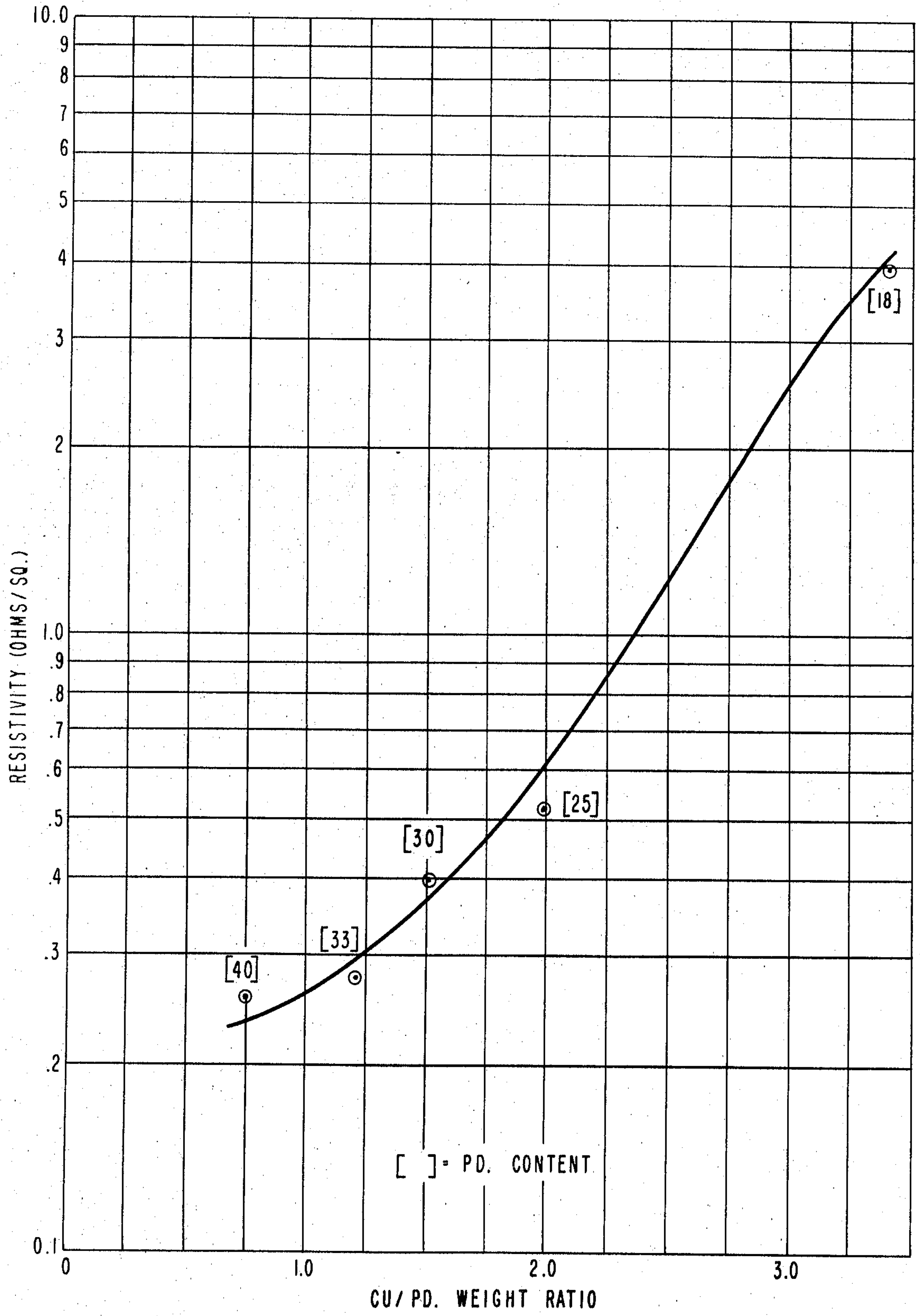
FIG. 1 shows the relationship of the Cu/Pd ratio to resistivity in Example 7.
Figure 2:
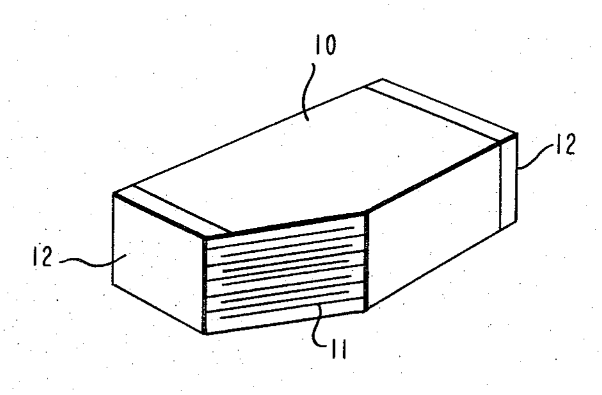
FIG. 2 shows a multilayer monolithic capacitor having electrodes 11 buried in a ceramic dielectric 10, with electrode terminations 12 at each end of the ceramic body; the corner of the capacitor is shown cut away to depict the buried electrodes.

The copper/palladium electrode metallizations of the present invention provide useful electrodes at high firing temperatures, cofireable with conventional green dielectrics, in addition to significant cost savings by virtue of the substitution of copper for noble metals.

The addition of copper (and/or compounds thereof) to palladium electrode metallizations does not merely provide cheaper effective metallizations by partial replacement of noble metals. As shown in the examples herein, there seems to be a synergistic effect, at least at certain metal concentrations, in the metallizing compositions of the present invention. Thus, it is shown that at certain Pd concentrations (33 percent in comparative showing B), a useful capacitor electrode was not formed, whereas by the addition in Example 3 of 12 percent $Cu_2O$ to the 33 percent Pd, an effective capacitor was formed. (At higher concentrations of metal (e.g., 45 percent) the Pd system did produce useful capacitors.)

Electrodes formed with the compositions of the present invention, it is theorized, may be a mixture of copper oxides and mixed crystals of Pd/Cu. See Gmelin, Handbuch der anorganischen Chemie, Volume 22, Pt[A], page 650, Verlag Chemie, Weinheim, 1951.

It is known that on being heated in air, Pd goes through the following sequence:

$$Pd \xrightarrow[300\text{–}600°C.]{} PdO \xrightarrow[800°C.]{} Pd,$$

and, while not intended to be limiting, it is thought that in the metallizations of the present invention the following occurs:

Pd + Cu (copper oxide) → PdO + Cu → Pd-Cu alloy

In such reactions it is seen that copper oxides can function as a source of oxygen for PdO formation, which oxygen Pd releases above by 800°C.

X-ray data (powder diffraction patterns) on fired electrodes of the present invention confirm that, regardless of starting material (e.g., Pd/CuO, Pd/$Cu_2O$, Pd/Cu, Pd/copper compounds, or any of these forms of Cu with PdO a reproducible interaction takes place to produce useful electrodes.

The X-ray pattern of a mixture of finely divided Cu and Pd (submicron particle size, surface area 0.1–2 $m^2/g$.) showed peaks at angles (related to *d* spacing) of about 46.5° (Pd), 43.2° (Cu) and 40.0° (Pd). After the powder had been heated to 800°C. either slowly over a 16-hour period or rapidly over a 30-minute period, mixed copper oxide/palladium oxide formation has taken place with resulting shifts in angles being observed (peaks at 34.0°, 34.6° and 40.2°). After further heating at 1,100°C., over a 30-minute period followed by 30 minutes at peak temperature, reduction of the mixed oxides occurred with the formation of conductive intermetallic compounds, as shown by well defined sharp diffraction angles at 40.8° and 47.6°, corresponding to *d* spacings of 2.21 and 1.91. These *d* spacing values lie between those associated with Cu and Pd; i.e., Cu, 2.09 and 1.81; Pd, 2.25 and 1.95.

The fired product was hard and nonbrittle, with metallic luster.

Copper may be supplied to the palladium-based electrode metallizations and metallizing compositions of the present invention either as the metal itself and/or an oxide of the metal (e.g., CuO, $Cu_2O$). When copper is supplied to the metallizations as the metal, a mixture of the respective metals may be employed or a finely divided coprecipitated alloy of the respective metals may be employed. The term copper oxide as used in the claims means CuO, $Cu_2O$ or a compound thermally decomposable to such oxides, including organic or inorganic copper compounds such as acetates, carbonates, sulfates and nitrates ("precursors" of copper oxide).

It is theorized that copper may be employed in the present invention in any of the above-recited forms due to the above-described chemical changes in terms of oxide formation and release during firing.

When it is said herein that copper and/or copper oxides may be substituted for noble metals in palladium metallizations or metallizing compositions, it is meant that copper and/or its oxides may be used in conjunction with palladium (and/or palladium oxide) alone or with palladium and minor amounts (less than 50 percent total noble metals) of other noble metals (e.g., 12 percent Ag based on total Pd/Ag/Cu).

In substituting Cu for Pd in the present invention, one will balance the amount of Cu present against the properties desired in the conductor. Generally, a useful upper limit on the amount of Cu is a Cu/Pd weight ratio (as metal) of about 2.5/1 (by weight), although in some instances the substrate employed may dictate the use of a much lower Cu/Pd ratio. A preferred ratio is in the range 0.1–2.0. Generally no practical advantage is observed where the Cu/Pd ratio is less than 0.01/1, although this is not intended to be limiting. Where Pd and minor amounts of other noble metals are present, the maximum ratio of Cu to Pd plus such other noble metals likewise will be about 2.5/1.

The metallizations should be finely divided to facilitate sintering and any reactions which occur. Furthermore, in the production of multilayer capacitors from green ceramic sheets, the presence of coarse particles as part of inner electrode prints would puncture the green dielectric sheets. Generally, the metallizations are such that at least 90 percent of the particles are no greater than 5 microns. In optimum metallizations substantially all the particles are less than 1 micron in size. Stated another way, the surface area of the particles is in the range 0.4–9 $m^2/g$., preferably 2–8 $m^2/g$.

Finely divided barium titanate may optionally be added to these metallizations, at levels up to about 10 percent, for the purpose of enhancing adherence of the metallization to the substrate and film continuity.

The metallizing compositions are prepared from the solids and vehicles by mechanical mixing. The metallizing compositions of the present invention are printed as a film onto ceramic dielectric substrates in the conventional manner. Generally, screen stenciling techniques are preferably employed. The metallizing composition may be printed either dry or in the form of a dispersion in an inert liquid vehicle.

Any inert liquid may be used as the vehicle. Water or any one of various organic liquids, with or without thickening and/or stabilizing agents and/or other common additives, may be used as the vehicle. Exemplary of the organic liquids which can be used are the aliphatic alcohols; esters of such alcohols, for example, the acetates and propionates; terpenes such as pine oil, α- and β-terpineol and the like; solutions of resins such as the polymethacrylates of lower alcohols, or solutions of ethyl cellulose, in solvents such as pine oil and the monobutyl ether of ethylene glycol monoacetate. The vehicle may contain or be composed of volatile liquids to promote fat setting after application to the substrate. Alternately, the vehicle may contain wakes, thermoplastic resins or like materials which are thermofluids, so that the vehicle containing metallizing composition may be applied at an elevated temperature to a relatively cold ceramic body upon which the metallizing composition sets immediately.

The ratio of inert vehicle to solids (glass-ceramic precursor and metal) in the metallizing compositions of this invention may vary considerably and depends upon the manner in which the dispersion of metallizing composition in vehicle is to be applied and the kind of vehicle used. Generally, from 1 to 20 parts by weight of solids per part by weight of vehicle will be used to produce a dispersion of the desired consistency. Preferably, 4–10 parts of solid per part of vehicle will be used. Optimum dispersions contain 30–70 percent liquid vehicle.

As indicated above, the metallizing compositions of the present invention are printed onto ceramic substrates, after which the printed substrate is fired to mature the metallizing compositions of the present invention, thereby forming continuous conductors. Although considerable advantage is afforded by the present invention where the compositions are printed on green ceramics and cofired therewith, this invention is not limited to that embodiment. The compositions of the present invention may be printed on prefired (cured) ceramics if so desired.

Although the printing, dicing, stacking and firing techniques used in multilayer capacitor manufacture vary greatly, in general the requirements for a metallizing composition used as an electrode are (1) reasonable (2 hours or less) drying time, (2) nonreactivity with green ceramic binders (reaction causes "curling" or even hole formation during printing and drying), (3) nonreactivity with ceramic components during firing (e.g., Pd reaction with bismuth causing shattering of capacitors), (4) stability during firing in air (i.e., does not become nonconductive), and (5) non-melting under peak firing conditions.

After printing of the electrode onto the green ceramic, the resulting pieces are then either dry or wet stacked to the appropriate number of layers (normally anywhere from 5 to 60 depending upon design), pressed (up to 3,000 psig with or without heat) and diced.

A typical firing cycle for multilayer capacitors comprises two phases. The first, which may last up to several days, is called bisquing. Maximum temperature reached may be anywhere from 600°–1,000°F. The purpose is the noncatostropic removal of organic binder both in the electrodes and the green sheets. After this is accomplished a rapid (6 hours or less) heat up to the desired "soaking" temperature for maturing of the ceramic takes place. Soaking temperature depends upon the composition of the ceramic. In general, with $BaTiO_3$ as the main component, soaking temperatures range from 1,240°C. to 1,400°C. (2,265°F. to 2,550°F.). Rate of cool down of the parts after soaking depends upon thermal shock considerations.

EXAMPLES

The following examples and comparative showings are presented to illustrate the advantages of the present invention. In the examples and elsewhere in the specification and claims, all parts, percentages, proportions, etc., are by weight.

Effective dielectric constant (effective K) and dissipation factor were determined as follows. The fired three-layer (2 buried electrodes) capacitors were mounted in the jaws of an automatic RLC Bridge (General Radio Model No. 1683) where both capacitance and D.F. were automatically read. Knowing the capacitance, dimensions of electrode and thickness of fired dielectric, effective K was determined from:

Effective K = (Reading in picofarads)(thickness)(2.9 $\times 10^{-2}$)/area of electrode thickness being in mils and area in square centimeters.

Resistivity was determined on 1-mil thick elements.

In the examples and comparative showings, all inorganic solids are finely divided; the maximum particle size was less than 5 microns.

Examples 1 and 2; Comparative Showing A

These examples show the use of metallizations of this invention comprising $Cu_2O$ or copper in the fabrication of multilayer capacitors, each of three dielectric layers encompassing two buried Pd/Cu conductor layers. The properties of the resultant capacitors are compared with those of more expensive electrodes of palladium only.

Green (unfired) barium titanate discs 0.5-inch in diameter and about 17-mils thick were used as the dielectric (available from American Lava Corporation), having a rated effective K of 2,000 at a recommended peak firing temperature of 1,320°C. A vehicle (Vehicle A) was prepared from 10 parts Hercules "Staybelite" rosin, 10 parts ethyl cellulose, 5 parts β-terpineol, 65 parts kerosine (200°–230°C. fraction) and 10 parts high-flash naphtha.

The metallizing composition of Example 1 was prepared by mixing 12 parts $Cu_2O$, 33 parts palladium and 55 parts Vehicle A and then roll milling the mixture (2 passes at 50 psig) to assure uniformity of the resultant composition. The metallizing composition was then screen printed (No. 325 screen, resultant print about 0.6-mil thick) onto each of two 0.5-inch diameter discs of the unfired dielectric, and then the printed discs were notched to give surfaces for subsequent electrical contact and laminated with a third sheet of the dielectric by pressing at 5,000 psig for 1 minute at room temperature. Ten capacitors were so prepared.

The metallizing composition of Example 2 was similarly prepared from 33 parts Pd, 11 parts Cu powder (−325 mesh) and 56 parts Vehicle A; and the metallizing composition of Showing A from 45 parts Pd and 55 parts Vehicle A. Laminates were prepared as in Example 1.

In each case the pressed parts were placed in a box furnace and the temperature was rasied to 500°C. over 24 hours; then held at 500°C. for 16 hours; then raised to 1,320°C. over 2 hours; held at 1,320°C. for 2 hours; allowed to cool to 1,000°C. and removed from the furnace. The resultant capacitors had the properties set forth in the Table. In the fired capacitor the dielectric layers were each about 15 mils thick, and the electrodes about 0.3 mil thick.

The fact that dielectric constant and dissipation factor are not degraded by the presence of copper in the resultant electrode (supplied via either the metal or an oxide) is important. Furthermore, no delamination was observed in the fired capacitors, nor was any evidence of electrode/dielectric reactions detected.

Example 3; Comparative Showing B

Example 3 and Comparative Showing B illustrate the improved behavior of the Pd/Cu metallizing compositions of the present invention over even that of metallizing compositions of Pd alone, at certain Pd concentrations in the metallizing composition (inorganic solid plus vehicle). In Examples 1 and 2 and Showing A, at about 45 percent inorganics in the inorganic/vehicle composition, both the Pd/Cu compositions of the present invention and the more expensive Pd compositions performed well. Holding the Pd content of the metallizing composition at 33 percent, the Pd/$Cu_2O$ composition of the present invention was operable, but not a composition containing only Pd.

In Example 3 a metallizing composition containing 33 percent Pd and 12 percent $Cu_2O$ in vehicle formed an operative capacitor, whereas 33 percent Pd (Showing B) in vehicle did not at the same firing temperature (1,250°C.).

The vehicle (Vehicle B) contained 0.2 part soya lecithin, 1.6 parts Hercules "Staybelite" rosin, 1.6 parts ethyl hydroxy ethyl cellulose, 0.8 part β-terpineol, 1.6 parts high-flash naphtha and 10.6 parts kerosine.

In Example 3, 10 parts Pd, 3.5 parts $Cu_2O$ and 16.5 parts Vehicle B were mixed, then roll milled 3 passes at 50 psig to assure uniformity. In Comparative Showing B, 10 parts Pd and 20 parts Vehicle B similarly treated. A series of 10 capacitors was formed with each composition by screen printing (No. 325 screen) the same on each side of an unfired $BaTiO_3$ chip 18-mils thick. The printed layer was about 0.8-mil thick.

The chips were then fired to 1,250°C. peak over 16 hours, 1 hour at peak temperature. The fired single layer capacitors (fired dielectric about 15-mil thick, fired electrode about 0.3-mil thick) had the characteristics set forth in the Table. The Pd control was ineffective, but the pressence of $Cu_2O$ led to an effective composition.

Example 4; Comparative Showings C and D

Three additional series of chips (10 per series) were prepared as in Example 3, but using a higher firing temperature (1,360°C. instead of 1,250°C.).

In Example 4, the metallizing composition of Example 3 was used (45 percent solids of Pd and $Cu_2O$); in Comparative Showing C a much more expensive noble metal composition of 39 parts Pd and 21 parts Ag was used (with 40 parts Vehicle B); and in Comparative Showing D, 45 parts of Pd alone (55 parts Vehicle B) were used, the inorganic content of the latter being similar to that of Example 3.

The data show that the Pd/$Cu_2O$ system of Example 4 performs better than the more expensive noble metal systems of Showings C and D at 1,360°C.

Examples 5 and 6

The equivalence of copper and $Cu_2O$ as starting materials in the metallizations of the present invention, indicated in Examples 1 and 2, is confirmed by the capacitors of these examples, prepared as in Example 3, but fired at 1,250°C. The composition used in Example 5 was that of Example 3. The same amount of Pd (10 parts) and 3.1 parts of copper (copper content equivalent to the 3.5 parts Cu of Example 3) were used with 16.9 parts of Vehicle B in Example 6. Comparable electrical results were obtained, as set forth in the Table.

Example 7

This example illustrates the effect of varying the ratio of Cu/Pd on the ability of Pd/$Cu_2O$ compositions to form useful conductors and, hence, capacitors. Generally, a Cu/Pd rato of 2.5/1 is a practical upper limit on copper content, assuming that resistances above about 2 ohms/square are to be avoided. Of course, if one can tolerate resistances substantially above 2 ohms/square, more copper can be used.

Capacitors were prepared as in Example 3, using Pd, $Cu_2O$ and Vehicle B. The solids/vehicle ratio was held at 60/40. Compositions were printed (200 mesh screen) on both fired $BaTiO_3$ chips and fired Alsimag chips. Peak firing temperature was 1,270°C. Results are plotted in FIG. 1, where the numbers in brackets indicate Pd content in total composition (Pd, $Cu_2O$, vehicle).

Comparative Showings, E, F and G

A goal of the compositions of the present invention is that they be cofireable with green ceramic substrates at high temperature to produce effective, low-cost capacitors. The behavior of several copper-containing metallizations containing large amounts of noble metals other than Pd was studied here, and the metallizations were found to be useless at 1,260°C. firing. At lower temperatures 1,050°C., two formed useful capacitors, but the firing temperature was too low to make them useful in cofiring with $BaTiO_3$, etc.

In Showings E, F and G, the process of Example 3 was repeated, except as follows, firing one set of samples at 1,050°C. and another at 1,260°C. Resistance values are reported in the Table.

In Showing E, 40 parts Au, 20 parts $Cu_2O$ and 40 parts Vehicle B did not produce useful capacitors at either 1,050°C. or 1,260°C., demonstrating the inapplicability of applicant's concept to gold rather than palladium systems.

In Showing F, 30 parts Au, 10 parts Pd, 20 parts $Cu_2O$ and 40 parts Vehicle B produced a capacitor at low firing temperature (1,050°C.) but not at 1,260°C.

In Showing G, 15 parts Pd, 15 parts Ag and 20 parts $Cu_2O$ (plus 50 parts Vehicle B) formed a capacitor at low temperatures but not at 1,260°C. This illustrates the importance of using only minor amounts of noble metals other than Pd in the Pd/Cu compositions of the present invention, since here equal amounts of Pd and Ag were ineffective at 1,260°C.

Example 8; Comparative Showing H

These runs show the effect of "previous history" of the metallization on production of useful capacitors.

In Showing H, the method of Example 3 was again repeated, using a firing temperature of 1,250°C. and the materials of Example 3, except that the 10 parts of Pd and 3.5 parts $Cu_2O$ were, before dispersion in Vehicle B, heated together at 850°C. for 30 minutes, cooled, ground, and screened through a 60-mesh screen (but not comminuted). The resulting capacitor was not useful, as seen in the Table.

By contrast, an alloy of Cu and Pd (Example 8) prepared by coprecipitation with $NaBH_4$ is within the present invention. The process of Example 3 was repeated with a 50:50 copper/palladium alloy prepared from a solution of 9.68 g. cupric nitrate and 5.42 g. palladium nitrate in 300 ml. water, which was neutralized with 6.2 g. sodium hydroxide. Then 1 g. $NaBH_4$ was added (100 ml of a 1 percent $NaBH_4$ solution), reducing the metals. The precipitate was washed and dried. It was confirmed to be alloy by X-ray examination. The alloy (50 parts) was dispersed in 50 parts Vehicle B and printed and sintered at 1,150°C. Data are found in the Table.

Examples 9–11

These examples show the use of copper compounds other than the oxide (precursors of oxides) in forming capacitors according to this invention. The compounds used were cupric acetate, sulfate and carbonate.

The procedure of Example 3 was repeated using as the paste 33 percent Pd (5 $m^2$/g.), and that weight of copper compound required to give 10 percent copper as metal, and Vehicle B. The firing temperature was 1,250°C.

The data in the Table show no difference in behavior with the acetate or carbonate; the sulfate did show lower conductivity, but was still satisfactory.

Examples 12, 12-1, 13, 14 and 14-1

In each of these examples palladium oxide was used instead of palladium; the data in the Table show the usefulness of this system. The procedure of Example 3 was used, the time at peak firing temperature being 30 minutes.

Examples 14 and 14-1 also included $BaTiO_3$ in the metallizing composition.

TABLE

| Example (No.) or Showing (letter) | Metallization Solids Per 100 parts Met. Comp. | Solid/Veh. Wt. Ratio | Cu/Pd Wt. Ratio | Firing Temp. | Effective K | D.F. (%) | Resistivity (1-mil thick) |
|---|---|---|---|---|---|---|---|
| | | | | (°C.) | | | (ohms/square) |
| 1 | 33 Pd/12 $Cu_2O$ | 45/55 | 0.3/1 | 1320 | 2425 | 1.4 | 1.2 |
| 2 | 33 Pd/11 Cu | 44/56 | 0.3/1 | 1320 | 2087 | 1.4 | 1.2 |
| A | 45 Pd | 45/55 | — | 1320 | 2013 | 1.4 | 0.8 |
| 3 | 33 Pd/12 $Cu_2O$ | 45/55 | 0.3/1 | 1250 | 2142 | 1.0 | 0.8 |
| B | 33 Pd | 33/67 | — | 1250 | — | — | infinite (zero capacitance) |
| 4 | Same as Example 3 | | | 1360 | 3577 | 1.1 | 0.8 |
| C | 39 Pd/21 Ag | 60/40 | — | 1360 | 2549 | 0.8 | 0.2 |
| D | 45 Pd | 45/55 | — | 1360 | 2446 | 0.9 | 0.3 |
| 5 | Same as Example 3 | | | 1250 | 2054 | 1.2 | 0.8 |
| 6 | 33 Pd/11 Cu | 44/56 | 0.3/1 | 1250 | 2064 | 1.0 | 0.8 |
| 7 | Pd/$Cu_2O$ (See FIG. 1) | 60/40 | — | 1270 | See FIG. 1 | | |
| E | 40 Au/20 $Cu_2O$ | 60/40 | — | 1050 | — | — | infinite |
| | | | | 1260 | — | — | (melted) |
| F | 30 Au/10 Pd/20 $Cu_2O$ | 60/40 | — | 1050 | — | — | 0.32 |
| | | | | 1260 | — | — | (melted) |
| G | 15 Pd/15 Ag/20 $Cu_2O$ | 50/50 | — | 1050 | — | — | 1.03 |
| | | | | 1260 | — | — | infinite |
| 8 | 25 Pd/25 Cu Alloy | 50/50 | 1/1 | 1150 | — | — | 1.4 |
| H | Prefired met. of Ex. 3 | as Example 3 | | 1250 | 9 | 34 | <100 |
| 9 | 33 Pd/32 $CuAc_2 \cdot H_2O$ | 66/34 | 0.3/1 | 1250 | 4424 | 1.8 | 0.3 |
| 10 | 33 Pd/19 $CuCO_3$ | 52/48 | 0.3/1 | 1250 | 4465 | 1.7 | 0.6 |
| 11 | 33 Pd/26 $CuSO_4$ | 59/41 | 0.3/1 | 1250 | 4155 | 1.6 | 1.8 |
| 12 | 40 PdO/12 $Cu_2O$ | 52/48 | 0.3/1 | 1270 | — | — | 0.51 |
| 12-1 | 40 PdO/12 $Cu_2O$ | 52/48 | 0.3/1 | 1320 | 4319 | 0.8 | 0.55 |
| 13 | 40 PdO/12 $Cu_2O$ | 52/48 | 0.3/1 | 1270 | — | — | 0.52 |
| 14 | 33 PdO/12 $Cu_2O$/5.4 $BaTiO_3$ | 50/50 | 0.4/1 | 1270 | — | — | 0.95 |
| 14-1 | 33 PdO/12 $Cu_2O$/5.4 $BaTiO_3$ | 50/50 | 0.4/1 | 1320 | 4355 | — | 0.8 |

I claim:

1. In metallizations of finely divided noble metal(s) useful for conductor formation, improved essentially glass-free metallizations of particles of (a) one or more members selected from the group of palladium, palladium oxide, and mixtures thereof and (b) one or more members from the group consisting of copper oxides and precursors thereof; the ratio of copper in (a), calculated as the element, to palladium in (b), calculated as the element, being up to 2.5/1, by weight; the particles of said metallization being of a size such that at least 90 percent by weight of said particles are not greater than 5 microns.

2. Metallizations of claim 1 dispersed in an inert liquid vehicle.

3. Metallizations according to claim 1 of palladium and $Cu_2O$.

4. Metallizations according to claim 1 of palladium and CuO.

5. Metallizations according to claim 1 of palladium oxide and $Cu_2O$.

6. Metallizations according to claim 1 of palladium oxide and CuO.

7. Metallizations of claim 1 additionally comprising up to 10 percent finely divided barium titanate.

8. A dielectric substrate having thereon a conductor of the composition of claim 1.

9. A dielectric substrate having thereon a conductor of the composition of claim 3.

10. A dielectric substrate having thereon a conductor of the composition of claim 4.

11. A dielectric substrate having thereon a conductor of the composition of claim 5.

12. Metallizations according to claim 1 of palladium oxide and CuO.

13. A multilayer capacitor having two or more electrodes of the sintered composition of claim 1.

14. A multilayer capacitor having two or more electrodes of the sintered composition of claim 3.

15. A multilayer capacitor having two or more electrodes of the sintered composition of claim 4.

16. A multilayer capacitor having two or more electrodes of the sintered compsoition of claim 5.

17. A multilayer capacitor having two or more electrodes of the sintered composition of claim 6.

* * * * *